(12) United States Patent
Jamneala et al.

(10) Patent No.: US 6,804,807 B2
(45) Date of Patent: Oct. 12, 2004

(54) METHOD OF CHARACTERIZING AN ELECTRONIC DEVICE HAVING UNBALANCED GROUND CURRENTS

(75) Inventors: Tiberiu Jamneala, San Francisco, CA (US); Paul D. Bradley, Mountain View, CA (US); David A. Feld, Newark, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 64 days.

(21) Appl. No.: 10/376,966

(22) Filed: Feb. 28, 2003

(65) Prior Publication Data

US 2004/0172607 A1 Sep. 2, 2004

(51) Int. Cl.[7] .............................................. G06F 17/50
(52) U.S. Cl. ..................... 716/4; 324/754; 324/755; 324/763
(58) Field of Search .................... 716/1, 4; 324/754, 324/759; 438/31; 333/12, 204

(56) References Cited

U.S. PATENT DOCUMENTS

| | | | | |
|---|---|---|---|---|
| 5,519,366 A | * | 5/1996 | Kaneko et al. | 333/204 |
| 6,469,383 B1 | * | 10/2002 | Welstand | 257/737 |
| 6,514,783 B1 | * | 2/2003 | Welstand | 438/31 |
| 6,639,322 B1 | * | 10/2003 | Welstand | 257/778 |
| 2002/0011856 A1 | * | 1/2002 | Huang et al. | 324/754 |

OTHER PUBLICATIONS

Havens et al., "Impact of Probe Configuration and Calibration Techniques On Quality Factor Determination of On–Wafer Inductors for GHz Applications," IEEE, Apr. 2002, pp. 19–24.*

Wang et al., "Measurement and Wavelet Denoising Parameters Extraction for MMIC On–Chip Square Spiral Inductors," IEEE, Dec. 2001, pp. 1330–1333.*

Safwat et al., "Sensitivity Analysis of Calibration Standards For Fixed Probe Spacing On–Wafer Calibration Techniques," IEEE, Jun. 2002, pp. 2257–2260.*

Arz et al., Wideband Frequency–Domain Characterization of High–Impedance Probes, ARFTG Conf. (NIST), 7 pages (Nov. 29, 2001).

Adamain et al., published U.S. patent application No. US 2002/0053899 A1, May 9, 2002.

* cited by examiner

*Primary Examiner*—Vuthe Siek

(57) ABSTRACT

An interface model of a ground-signal-ground ("GSG") probe is included when simulating an electronic circuit that develops unbalanced ground currents. The interface model of the GSG probe is used to obtain simulated results that more closely match data measured from the electronic device when using the GSG probe.

19 Claims, 4 Drawing Sheets

METHOD OF CHARACTERIZING AN ELECTRONIC DEVICE HAVING UNBALANCED GROUND CURRENTS

CROSS-REFERENCE TO RELATED APPLICATIONS

Not applicable.

STATEMENT REGARDING FEDERALLY SPONSORED RESEARCH OR DEVELOPMENT

Not applicable.

REFERENCE TO MICROFICHE APPENDIX

Not applicable.

FIELD OF THE INVENTION

The present invention relates generally to characterization of high-frequency electronic devices and more particularly to simulation and measurement of electronic devices using ground-signal-ground probes.

BACKGROUND OF THE INVENTION

Ground-signal-ground ("GSG") probes are used to make radio-frequency ("RF") and microwave ("MW") measurements of electronic devices. A GSG probe has a signal probe contact ("finger") between two ground probe fingers and can be used to measure electronic devices on wafer before they are separated for packaging. The GSG probe is brought in contact with the corresponding GSG pads on the electronic device and couples the device to a test instrument, such as a network analyzer, through a test cable.

Non-idealities in the test system (network analyzer, cables, fixture, etc.) introduce errors in the measured S-parameters that characterize the device under test ("DUT"). Some of these errors can be removed by calibrating the test system with calibration standards that provide equal ("balanced") currents through their ground paths. These errors are typically non-idealities in the signal path of the test system ("signal path errors"). The errors in the test system will remain corrected as long as the current through the first ground finger of the GSG probe is assumed to be equal to the current through the second ground finger of the GSG probe when measuring an electronic device.

Unfortunately, some electronic devices do not produce balanced ground currents. If the ground currents of the measured electronic device are not equal, measurement errors, which are caused by non-idealities in the ground paths of the test system ("ground paths errors"), cannot be removed after calibration, resulting in an inaccurate measurement of the electronic device.

BRIEF SUMMARY OF THE INVENTION

An interface circuit model of a GSG probe (hereinafter "GSG interface model") accounts for ground paths errors of a GSG probe that are not calibrated out using conventional calibration techniques. This GSG interface model can be thought of as existing at the interface between the calibrated GSG probe and a device under test ("DUT"), and can account for the measurement errors caused by unbalanced ground currents. In one embodiment, the GSG interface model includes a through path between a signal node and a signal source, a first inductance between a first ground node and a common ground, a second inductance between a second ground node and the common ground, and a mutual inductance between the first inductance and the second inductance.

The GSG interface model can be used to characterize electronic circuits having unbalanced ground currents. In one embodiment, a circuit model of an electronic device and a GSG interface model are entered into a simulator. The circuit model of the electronic device includes at least one signal port with associated first and second ground nodes (pads). The GSG interface model includes a first inductance between a common ground and the first ground node, a second inductance between the common ground and the second ground node, and a mutual inductance between the first self-inductance and the second self-inductance. A simulation of the electronic circuit and GSG probe is run to obtain a simulated characteristic of the electronic circuit and GSG probe. The simulated characteristic can be compared to the characteristic of the electronic device measured with the GSG probe, such as an on-wafer measurement of the electronic device.

In some embodiments, the value of the first inductance is equal to the value of the second inductance, and the value of the mutual inductance is the negative of the first inductance. In a particular embodiment, the first inductance and second inductance is $L_{corr}=(L_g-M_2)/2$, and the value of the mutual inductance is $M_{corr}=-(L_g-M_2)/2$, where $L_g$ is the self-inductance of a ground finger of the GSG probe and $M_2$ is the mutual inductance between the first ground finger and the second ground finger of the GSG probe.

DETAILED DESCRIPTION OF THE EMBODIMENTS

I. Introduction

Simulators, such as an AGILENT ADVANCED DESIGN SYSTEM ("ADS") or AGILENT HIGH FREQUENCY STRUCTURE SIMULATOR ("HFSS") are often used to evaluate a design of an electronic device. A circuit model of the electronic device is loaded into a simulator, which generates an expected response of the electronic device. For example, the transmission characteristic and reflection characteristic of the electronic device can be predicted using a simulator. Evaluating the predicted response allows a circuit designer to see how different circuit configurations and component values affect the performance of the electronic device without having to fabricate a device. Once a device has been fabricated, it is typically measured in a test system and the test results are compared with the predicted response from the simulator.

If the circuit model is accurate, the predicted response from the simulator should match the measured test results of the device. A film-bulk-acoustic resonator ("FBAR") filter was designed using a simulator, and FBAR filters were fabricated on a wafer and tested using a model 8753™ network analyzer from AGILENT TECHNOLOGIES, INC., and ACP™ GSG probes from CASCADE MICROTECH, INC. The on-wafer test results of the fabricated FBAR filter did not match the response predicted by the simulator. In some cases, the circuit designer might think that the difference between the simulated and test results arose because of a problem in fabricating the electronic device, or that the circuit model used in the simulator was not accurate. However, in this case the designer used alternative measurement techniques to confirm that the electronic device was performing according to its circuit model, and sought to determine the cause of the difference between the simulated and measured results.

Before an electronic device is measured on an RF or MW test system, the test system is typically calibrated with a set of calibration standards, such as short-open-load-through ("SOLT") standards. The GSG probe fingers are brought in contact with the calibration standards and the response of the test system is measured with a network analyzer or similar instrument. Calibrating the test system removes static errors arising from the test cables and fixture up to the calibration plane, which in this case is the end of the GSG probe. However, conventional calibration techniques assume a common ground at the calibration plane, and this is the condition provided by conventional calibration standards. It was realized that ground fingers of the GSG probe might not provide the assumed common ground if the currents through both ground fingers were not balanced. In this case, the calibration did not remove the dynamic errors arising from the unbalanced flow of ground current through the ground fingers of the GSG probes arising from the FBAR filter.

II. An Exemplary GSG Probe and GSG Interface Model

Figure 1A:
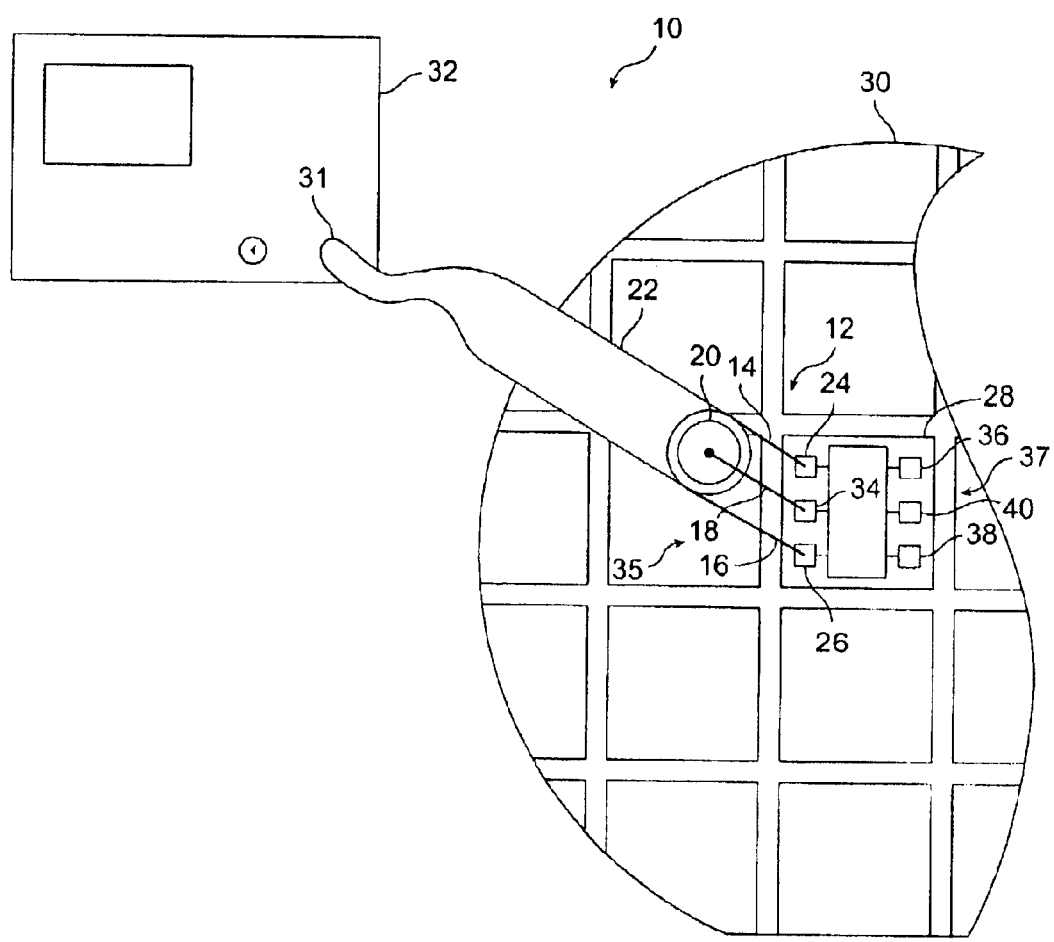
FIG. 1A shows a test system with a GSG probe contacting an electronic device on a wafer.

FIG. 1A shows a test system 10 with a GSG probe 12 contacting an electronic device 28 on a wafer 30. The GSG probe 12 includes a first ground finger 14, a second ground finger 16, and a signal finger 18. The first ground finger 14 and the second ground finger 16 extend from the outer conductor 20 of a coaxial transmission structure 22 to contact ground pads 24, 26 of the electronic device 28.

The outer conductor 20 of the coaxial transmission structure 22 ties the first 14 and second 16 ground fingers to a common electronic ground. The signal finger 18 contacts a signal pad 34 of the electronic device. A test port 31 of a network analyzer 32 is connected to the GSG probe 12 and electronic device 28 through the coaxial transmission structure 22.

Generally, a signal pad and its associated ground pads are known as a "port" 35 of the electronic device. A second port 37 of the electronic device 28 has ground pads 36, 38 and a signal pad 40 that are typically coupled to another GSG probe (not shown for simplicity of illustration) during testing. Similarly, the wafer 30 includes other electronic devices, which may be the same as or different from the illustrated electronic device 28, that are not shown in detail for simplicity of illustration.

The signal finger 18 provides an electronic signal to the electronic device 28 being tested, and the ground fingers 14, 16 provide return current paths. Even though the ground fingers 14, 16 are typically very small and extend only a short distance from the outer conductor 20 of the coaxial transmission structure 22, the ground fingers 14, 16 have self-inductance and mutual inductance that can introduce measurement error when the currents in the ground fingers 14, 16 are unbalanced, especially at high frequencies or when measuring small signal levels.

Figure 1B:
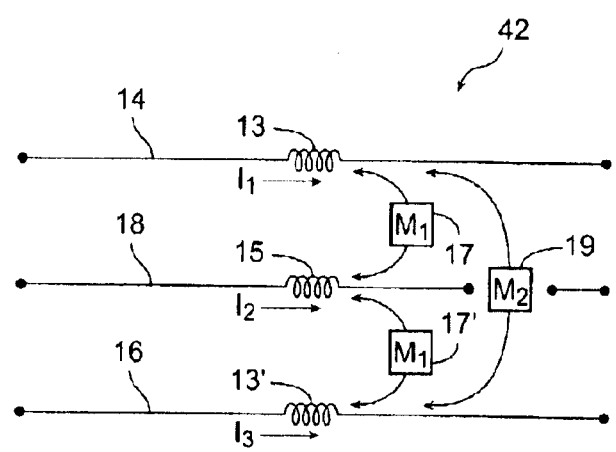
FIG. 1B shows an inductive circuit model of the GSG probe illustrated in FIG. 1A.

FIG. 1B shows an inductive circuit model 42 of the GSG probe 12 illustrated in FIG. 1A. A more general model of the GSG probe 12 might include resistive and capacitive elements, but these are generally accounted for during a conventional calibration of the test system and hence omitted from FIG. 1B. A first inductor 13 represents is the self-inductance, $L_g$, of the first ground finger 14. A second inductor 15 represents the self-inductance, $L_s$, of the signal finger 18. A mutual inductance 17 represents the mutual inductance $M_1$ between the signal finger 18 and the first ground finger 14. A similar mutual inductance 17' arises between the signal finger 18 and the second ground finger 16. Another mutual inductance 19 represents the mutual inductance $M_2$ between the first ground finger 14 and the second ground finger 16. As understood by those skilled in the art, mutual inductance arises between current-carrying elements, and is commonly represented as a double-ended arc between the current-carrying elements, as shown. It is assumed that $L_g$ is the same for the second ground finger 16 in this inductive circuit model, but this assumption is not necessary for circuit models of other GSG probes.

The current through the first ground finger 14 is $I_1$, the current through the signal finger 18 is $I_2$, and the current through the second ground finger 16 is $I_3$. For an arbitrary distribution of currents, the currents in the fingers sum to zero. The voltage on all three fingers is assumed to be zero after a balanced calibration; however, in the arbitrary condition an approximation of the voltage drop on the first ground finger 14 is:

$$V_1 = -L_g \frac{dI_1}{dt} - M_1 \frac{dI_2}{dt} - M_2 \frac{dI_3}{dt}$$

In the balanced case after calibration $V_1=0$ and $I_1=I_3=-\frac{1}{2}I_2$ (i.e. $I_2=-I_1-I_3$), leading to:

$$V_1^{balanced} = 0 = +\frac{1}{2}L_g \frac{dI_2}{dt} - M_1 \frac{dI_2}{dt} + \frac{1}{2}M_2 \frac{dI_2}{dt}$$

Solving for $M_1$ in the balanced case and substituting the result in the arbitrary case eliminates $M_1$ from both equations, and substituting $I_2$ with $(-I_1-I_3)$ results in:

$$V_1 = -\frac{L_g - M_2}{2} \frac{dI_1}{dt} + \frac{L_g - M_2}{2} \frac{dI_3}{dt}$$

Which can be put in the form:

$$V_1 = -L_{corr}\frac{dI_1}{dt} - M_{corr}\frac{dI_3}{dt}$$

Where:

$$L_{corr} = \frac{L_g - M_2}{2}$$

$$M_{corr} = -\frac{L_g - M_2}{2}$$

$L_{corr}$ (the correction for self inductance on the ground fingers 14, 16) is greater than zero and $M_{corr}$ (the correction for mutual inductance between the ground fingers) is less than zero when the self-inductance of a ground finger is greater than the mutual inductance between ground fingers (i.e. when $L_g > M_2$). The voltage drop on the second ground finger 16 can be solved in an identical fashion to produce identical corrections. The voltage drop on the signal finger 18 is:

$$V_2 = -L_s\frac{dI_2}{dt} - M_1\frac{dI_1}{dt} - M_1\frac{dI_3}{dt}$$

After calibration with balanced ground currents ($I_1 = I_3 = -\frac{1}{2}I_2$):

$$V_2^{balanced} = 0 = -L_s\frac{dI_2}{dt} + \frac{1}{2}M_1\frac{dI_2}{dt} + \frac{1}{2}M_1\frac{dI_2}{dt}$$

Solving for the $L_s$ term in the balanced case and then substituting the result in the arbitrary case and using the fact that $I_1 + I_3 = -I_2$, the voltage drop on the signal finger 18 reduces to zero. Thus, no correction is necessary for the signal finger in the unbalanced condition.

Figure 1C:
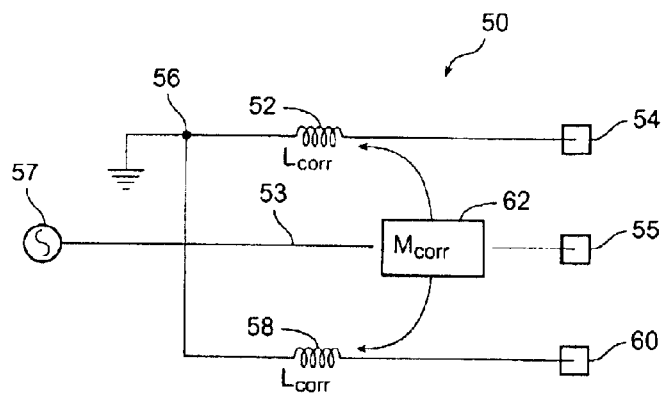
FIG. 1C shows a GSG interface model arising from unbalanced ground currents.

FIG. 1C shows a GSG interface model 50 arising from unbalanced ground currents. A first inductance 52 is between a first ground node 54 and a common ground 56. A second inductance 58 is between a second ground node 60 and the common ground 56, and a mutual inductance 62 is between the first inductance 52 and the second inductance 58. The first inductance 52 and second inductance 58 each have a value of $L_{corr} = (L_g - M_2)/2$, and the mutual inductance 62 has a value of $M_{corr} = -(L_g - M_2)/2$. A through path 53 is provided to represent the signal finger (see FIG. 1A, ref. num. 18) of the GSG probe, and connects a signal node 55 to a signal source 57, such as a test port of a simulator. This GSG interface model 50 assumes that the self-inductance of one ground finger of the GSG probe is the same as the self-inductance of the second ground finger.

The GSG interface model 50 is typically unique for each type of GSG probe because the GSG interface model 50 depends on the self-inductance ($L_g$) of the ground fingers and the mutual inductance between the ground fingers ($M_2$), which are usually different for different types of probes. Various techniques are available for measuring or calculating the values of the self inductance and mutual inductance, and in some instances the manufacturer of the GSG probe can provide these values.

III. Example of an Electronic Circuit with Unbalanced Ground Currents

Figure 2A:
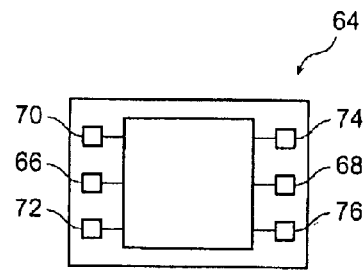
FIG. 2A shows a plan view of an electronic device with multiple ground pads.

FIG. 2A shows a plan view of an electronic device 64 with multiple ground pads 70, 72, 74, 76. The electronic device 64 is a 2-port FBAR personal communication system ("PCS") band filter ("filter") with two signal pads 66, 68 representing the input and output of the filter, and four ground pads 70, 72, 74, 76. The first ground pad 70 and the second ground pad 72 are associated with the first signal pad 66, and the third ground pad 74 and the fourth ground pad 76 are associated with the second signal pad 78. A circuit model of the electronic device was created and entered into an ADS simulator. A GSG interface model 50 of an ACP™ GSG probe in accordance with FIG. 1C was also created.

The GSG interface model 50 of the GSG probe shown in FIG. 1C can be entered into a simulator to generate simulated results that will more nearly match test data measured with the GSG probe. Bringing the simulated results into closer agreement with measured test data enables a circuit designer to achieve a better understanding of how the electronic device is operating.

Figure 2B:
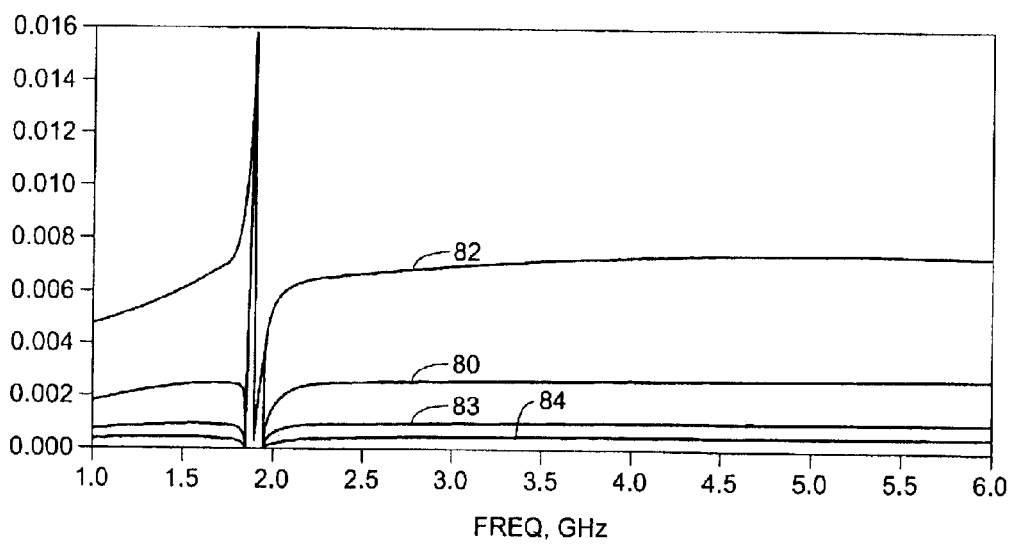
FIG. 2B shows the expected ground currents versus frequency for the electronic device of FIG. 2A.

FIG. 2B shows the expected ground currents versus frequency for the electronic device of FIG. 2A based on an ADS™ simulation. The y-axis represents the current through the ground pads 70, 72, 74, 76 in relative units. Current plots 80, 82, 84, 86 were generated by inserting ideal current meters between each ground pad of a circuit model of the electronic device and a common ground in the ADS simulator. The first plot 80 shows the current through the first ground pad 70. The second plot 82 shows the current through the second ground pad 72. The third plot 84 shows the current through the third ground pad 74, and the fourth plot 86 shows the current through the fourth ground pad 76. These plots illustrate that the currents through the ground pads of the filter are not equal, and change over frequency. The impedance of the GSG probe would change over frequency due to the self-inductance and mutual inductance of the GSG probe ground fingers, which cannot be calibrated out of a test system using conventional calibration methods because the unbalanced ground currents arise from the electronic circuit being tested.

IV. Simulated Circuit Results

Figure 3A:
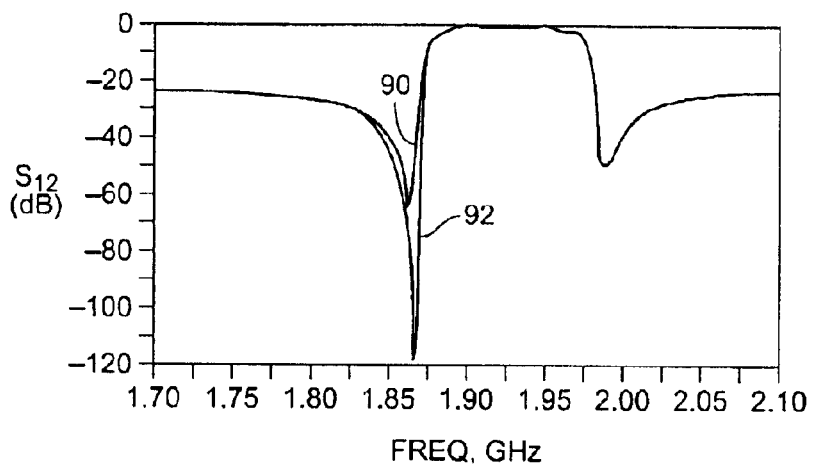
FIG. 3A shows simulated transmission characteristics ($S_{12}$) for the electronic device of FIG. 2A.

FIG. 3A shows simulated transmission characteristics ($S_{12}$) for the electronic device of FIG. 2A. A first plot 90 shows the transmission characteristic for the electronic device with a GSG interface model 50 having the corrections $L_{corr}$ and $M_{corr}$ in accordance with FIG. 1C for the ACP™ GSG probe included in the simulation. The self-inductance $L_{corr}$ was included between all four ground pads of the electronic device and a system (common) ground of the simulator, and the mutual inductance, $M_{corr}$, was included between the ground pads of the circuit input, and also between the ground pads of the circuit output. The value used for $L_{corr}$ was 0.15 nH, and the value used for $M_{corr}$ was −0.15 nH. The values for $L_{corr}$ and $M_{corr}$ inductances were obtained by measuring the electronic device with calibrated ACP™ probes, and then iterating the simulation to obtain a best-fit between the simulated transmission characteristic and the measured transmission characteristic by varying the inductance values of the GSG interface model 50. A second plot 92 shows the transmission characteristic of the filter without the GSG interface model 50 included in the simulation.

Thus, the second plot 92 represents the expected $S_{21}$ characteristic of the electronic device, while the first plot 90 represents the expected $S_{21}$ characteristic of the electronic device measured with ACP™ GSG probes. Without understanding the errors arising from unbalanced ground currents in the GSG probe, a circuit designer might alter his design of the electronic device to overcome the effects of the unbalanced ground currents based on wafer-test measurements. However, the inductances of the GSG probe will not contribute to the performance of the electronic device after it is separated from the wafer and packaged. Even though a network analyzer assumes that all grounds are tied together in a single ground, a simulator allows a GSG interface model 50 to be added to the circuit model of the electronic device being simulated. Thus, including a GSG interface model 50 in the simulation enables the circuit designer to check between wafer-test measurements and the simulated results with greater confidence that the electronic device is performing as intended.

Figure 3B:
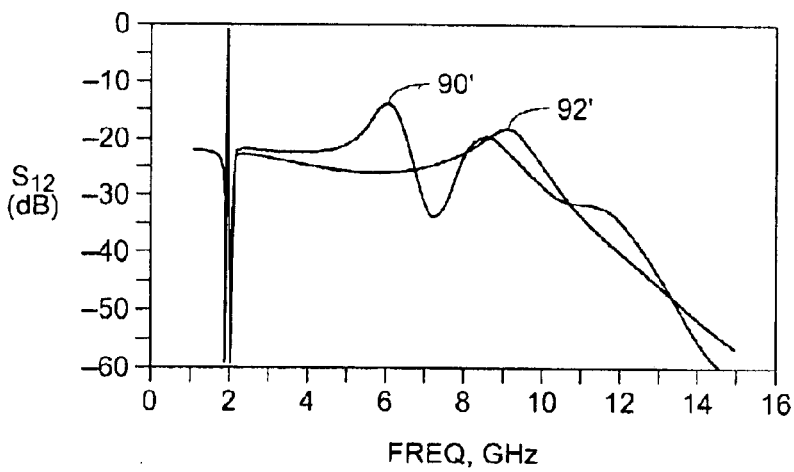
FIG. 3B shows the simulated transmission characteristics of FIG. 3A over a wider frequency range and more sensitive $S_{21}$ (dB) scale.

FIG. 3B shows simulated transmission characteristics ($S_{12}$) of FIG. 3A over a wider frequency range and more sensitive $S_{21}$ (dB) scale. The first plot 90' shows the transmission characteristic of the electronic device with the GSG interface model 50 of FIG. 1C included in the simulation, and the second plot 92' shows the transmission characteristic of the electronic device without the GSG interface model 50 included in the simulation.

Figure 3C:
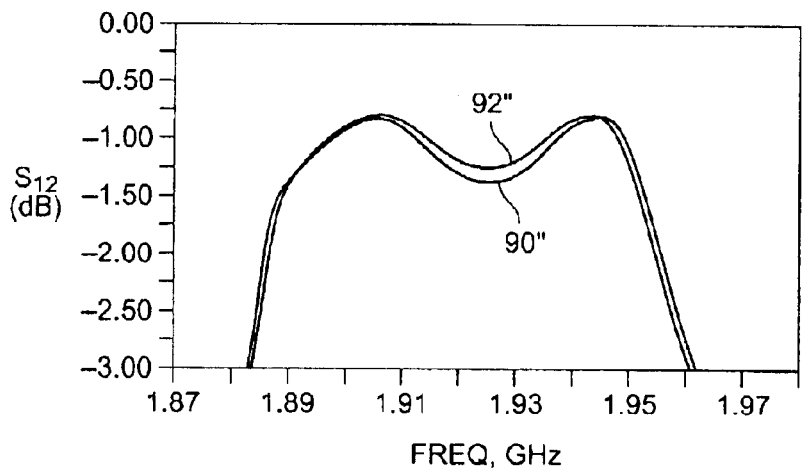
FIG. 3C shows the simulated transmission characteristics of FIG. 3A over a narrower frequency range and more sensitive $S_{21}$ (dB) scale.

FIG. 3C shows the simulated transmission characteristics ($S_{12}$) of FIG. 3A over a narrower frequency range and more sensitive $S_{21}$ (dB) scale. The first plot 90" shows the transmission characteristic of the electronic device with the GSG interface model 50 of FIG. 1C included in the simulation, and the second plot 92" shows the transmission characteristic of the electronic device without the GSG interface model 50 included in the simulation model.

Figure 4:
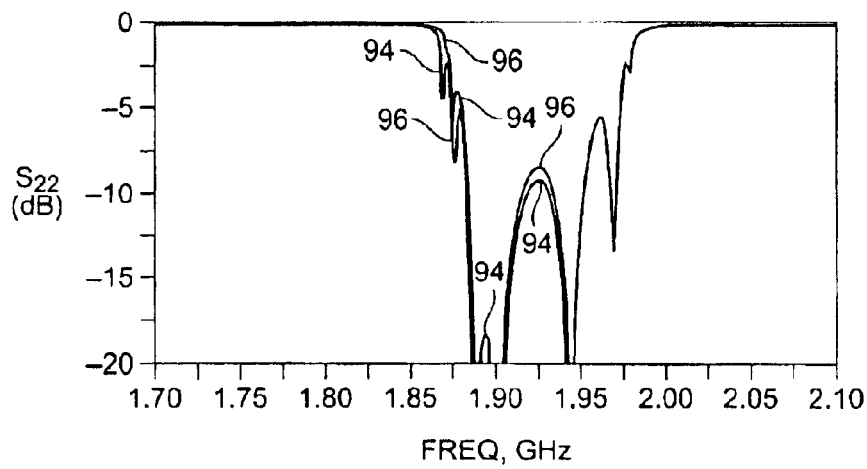
FIG. 4 shows simulated reflection characteristics ($S_{22}$) of the electronic device of FIG. 2A.

FIG. 4 shows simulated reflection characteristics ($S_{22}$) of the electronic device of FIG. 2A. The first plot 94 shows the return loss characteristic of the electronic device with the GSG interface model 50 of FIG. 1C included in the simulation model, and the second plot 96 shows the return loss characteristic of the electronic device without the GSG interface model 50 included in the simulation model.

An FBAR PCS band filter was fabricated in accordance with the circuit model used to obtain the simulation results shown the second plots 92, 92', 92", 96 of FIGS. 3A–3C and 4. When the FBAR PCS band filter was tested using ACP™ GSG probes, the measured data was consistent with the simulated data that included the GSG interface model 50, i.e. the first plots 90, 90', 90", and 94. A custom PYRAMID™ GSG probe, also available from CASCADE MICROTECH, INC., was built that contacted the ground and signal pads of the filter with very small 0.05 mm (0.002 inch) bumps, rather than fingers. The small bumps effectively eliminated ground parasitics of the GSG probe.

When the filter was measured with the PYRAMID™ probe, the measured data was consistent with the simulated data that did not include the circuit model for the GSG probe, i.e. the second plots 92, 92', 92", and 96. While the custom GSG probe provided measured data that closely corresponded to the expected circuit performance, such probes are more difficult to use in a production environment than the ACP™ probes.

V. Exemplary Methods

Figure 5:
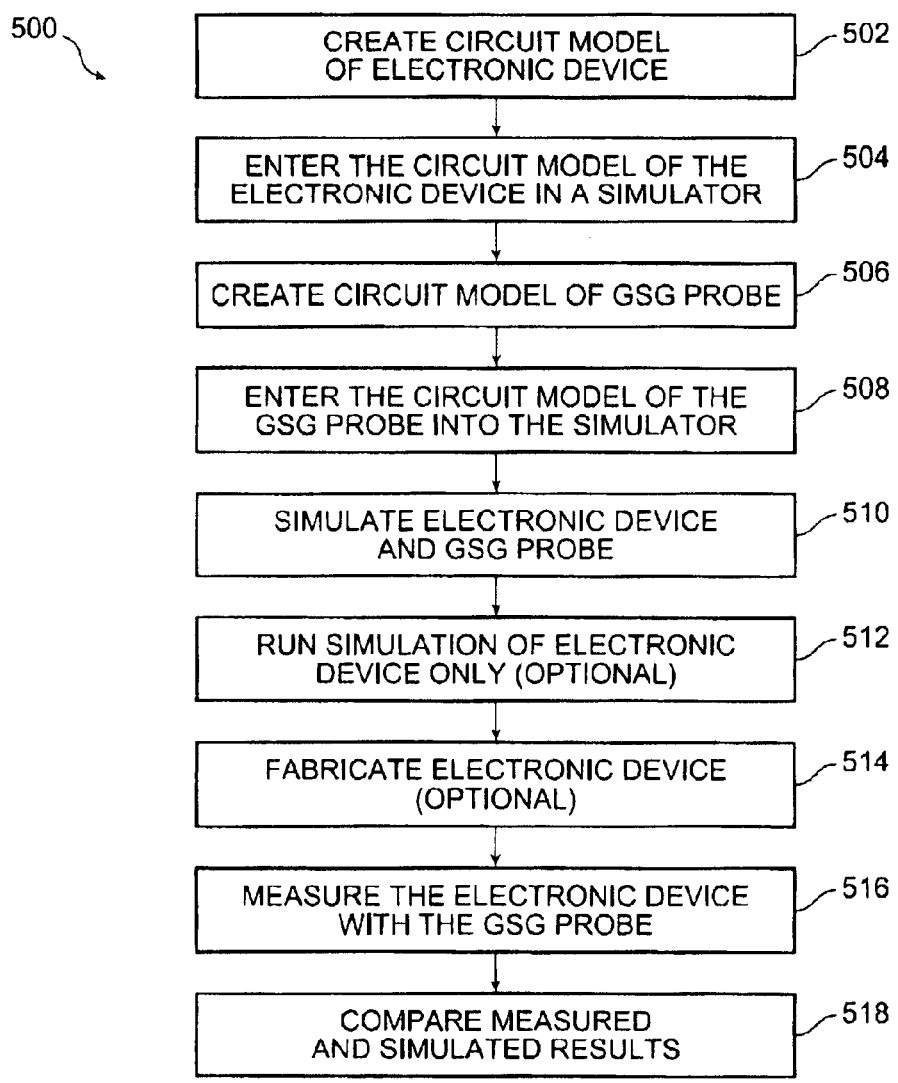
FIG. 5 shows a flow chart of a method of characterizing an electronic device wherein the electronic device generates unbalanced ground currents.

FIG. 5 shows a flow chart 500 of a method of characterizing an electronic device wherein the electronic device creates unbalanced ground currents. A circuit model of the electronic device is created (step 502) and entered into a simulator (step 504). The circuit model includes at least one signal port with a first ground node and a second ground node being associated with the signal port. A GSG interface model is created (step 506) having a through path, a first inductance, a second inductance, and a third inductance. The GSG interface model is entered into the simulator (step 508), with the through path being connected between a signal source and a signal node of the circuit model of the electronic device, the first inductance being connected between the first ground node of the circuit model of the electronic device and a common ground, the second inductance being connected between the second ground node of the circuit model of the electronic device and the common ground, and the third inductance being connected across the first inductance and the second inductance. A simulation of the electronic circuit and GSG interface model is run to obtain a simulated characteristic of the GSG probe and electronic circuit (step 510). A second simulation of the electronic circuit without the GSG interface model may optionally be run to obtain the characteristic of the electronic device without the effects of the GSG probe (step 512). In a further embodiment, the electronic device is fabricated (step 514) and is measured with the GSG probe (step 516), which may be an on-wafer measurement, to obtain a measured characteristic of the electronic device. The measured characteristic is then compared to the simulated characteristic (step 518).

In some embodiments, the value of the first inductance in the GSG interface model is equal to the value of the second inductance, and the value of the third inductance is equal to the negative of the first inductance. In a particular embodiment, the value of the first inductance is $L_{corr}=(L_g-M_2)/2$, which is also the value of the second inductance, and the value of the third inductance is $M_{corr}=-(L_g-M_2)/2$, where $L_g$ is the self-inductance of a ground finger of the GSG probe and $M_2$ is the mutual inductance between the first ground finger and the second ground finger of the GSG probe.

Computer-executable instructions for performing methods of the present invention are stored on a computer-readable medium, such as a magnetic disk, diskette, or tape, optical compact disk read-only memory ("CD-ROM"), electronic read-only memory ("ROM") in some embodiments. In other embodiments, a computer-readable medium has a computer-readable interface circuit model of a G-S-G probe stored as a data structure. The computer-readable interface circuit model of the G-S-G probe is used in a simulator or other test, measurement, or circuit modeling application.

While the preferred embodiments of the present invention have been illustrated in detail, it should be apparent that modifications and adaptations to these embodiments might occur to one skilled in the art without departing from the scope of the present invention as set forth in the following claims.

What is claimed is:

1. An interface circuit model comprising:
   a through path of a ground-signal-ground probe between a signal node and a signal source;
   a first inductance between a first ground node and a common ground;
   a second inductance between a second ground node and the common ground; and
   a mutual inductance between the first inductance and the second inductance.

2. The interface circuit model of claim 1 wherein the first inductance has a first value and the second inductance has the first value.

3. The interface circuit model of claim 2 wherein the mutual inductance has a second value equal to a negative of the first value.

4. The interface circuit model of claim 2 wherein the first value is positive.

5. The interface circuit model of claim 1 wherein the first inductance is $(L_g-M_2)/2$, where $L_g$ is a self-inductance of a ground finger of the ground-signal-ground probe and $M_2$ is a mutual inductance between the first ground finger and a second ground finger of the ground-signal-ground probe.

6. The interface circuit model of claim 1 wherein the first inductance has a first value equal to $(L_g-M_2)/2$, the second inductance has the first value, and the mutual inductance has a second value equal to $-(L_g-M_2)/2$, where $L_g$ is a self-inductance of a ground finger of the ground-signal-ground probe and $M_2$ is a mutual inductance between the first ground finger and a second ground finger of the ground-signal-ground probe.

7. A computer-readable medium having stored thereon a computer-readable interface circuit model according to claim 1.

8. A method of characterizing an electronic device comprising:
creating a circuit model of the electronic device having a first ground node, a second ground node, and a signal node;
creating an interface circuit model of a ground-signal-ground probe having a through path, a first inductance, a second inductance, and a third inductance;
entering the circuit model of the electronic device into a simulator;
entering the interface circuit model into the simulator, with the first inductance being connected between the first ground node and a common ground, the second inductance being connected between the second ground node and the common ground, and the third inductance being connected between the first inductance and the second inductance; and
running the simulator to obtain a simulated characteristic of the electronic circuit and the ground-signal-ground probe.

9. The method of claim 8 wherein the first inductance has a first value, the second inductance has the first value, and the third inductance has a second value that is a negative of the first value.

10. The method of claim 8 wherein the first inductance and the second inductance each have a first value of $(L_g-M_2)/2$, and the third inductance has a second value of $-(L_g-M_2)/2$, where $L_g$ is the self-inductance of a ground finger of the ground-signal-ground probe and $M_2$ is the mutual inductance between the first ground finger and the second ground finger of the ground-signal-ground probe.

11. The method of claim 8 further comprising a step of:
running the simulator without the interface circuit model of the ground-signal-ground probe to obtain a second simulated characteristic.

12. The method of claim 8 further comprising a step of:
fabricating the electronic device;
measuring the electronic device with the ground-signal-ground probe to obtain a measured characteristic; and
comparing the simulated characteristic to the measured characteristic.

13. The method of claim 12 wherein the step of measuring the electronic device comprises an on-wafer measurement.

14. A computer-readable medium having computer-executable instructions stored thereon for performing the method of claim 8.

15. A computer-readable medium having stored thereon a data structure comprising:
a first field containing data representing a through path of a ground-signal-ground probe between a signal node and a signal source;
a second field containing data representing a first inductance between a first ground node and a common ground;
a third field containing data representing a second inductance between a second ground node and the common ground; and
a fourth field containing data representing a mutual inductance between the first inductance and the second inductance.

16. The computer-readable medium of claim 15 wherein the first inductance has a first value and the second inductance has the first value.

17. The computer-readable medium of claim 16 wherein the mutual inductance has a second value equal to a negative of the first value.

18. The computer-readable medium of claim 15 wherein the first inductance is $(L_g-M_2)/2$, where $L_g$ is a self-inductance of a ground finger of the ground-signal-ground probe and $M_2$ is a mutual inductance between the first ground finger and a second ground finger of the ground-signal-ground probe.

19. The computer-readable medium of claim 15 wherein the first inductance has a first value equal to $(L_g-M_2)/2$, the second inductance has the first value, and the mutual inductance has a second value equal to $-(L_g-M_2)/2$, where $L_g$ is a self-inductance of a ground finger of the ground-signal-ground probe and $M_2$ is a mutual inductance between the first finger and a second ground finger of the ground-signal-ground probe.

* * * * *